US009819479B2

(12) United States Patent
Degani et al.

(10) Patent No.: US 9,819,479 B2
(45) Date of Patent: Nov. 14, 2017

(54) DIGITALLY CONTROLLED TWO-POINTS EDGE INTERPOLATOR

(71) Applicant: Intel IP Corporation, Santa Clara, CA (US)

(72) Inventors: Ofir Degani, Haifa (IL); Rotem Banin, Pardes-Hana (IL); Sebastian Sievert, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/868,834

(22) Filed: Sep. 29, 2015

(65) Prior Publication Data

US 2017/0093556 A1    Mar. 30, 2017

(51) Int. Cl.
| | | |
|---|---|---|
| H04L 27/36 | (2006.01) | |
| H04L 7/00 | (2006.01) | |
| H03F 3/24 | (2006.01) | |
| H03M 1/68 | (2006.01) | |
| H03F 3/217 | (2006.01) | |
| H03M 1/82 | (2006.01) | |

(52) U.S. Cl.
CPC ........... *H04L 7/002* (2013.01); *H03F 3/2178* (2013.01); *H03F 3/245* (2013.01); *H03M 1/68* (2013.01); *H04L 7/0091* (2013.01); *H04L 27/365* (2013.01); *H03M 1/82* (2013.01)

(58) Field of Classification Search
CPC .............................. H04B 1/0475; H04L 27/36
USPC ........................................................ 375/295
See application file for complete search history.

(56) References Cited

U.S. PATENT DOCUMENTS

| | | | | |
|---|---|---|---|---|
| 6,735,349 | B1 * | 5/2004 | Agarwal | ............... G06T 3/4007 |
| | | | | 382/298 |
| 7,868,672 | B2 * | 1/2011 | Geng | ................... H03C 3/0925 |
| | | | | 327/149 |
| 8,222,966 | B2 | 7/2012 | Ravi et al. | |
| 8,390,349 | B1 | 3/2013 | Ravi et al. | |
| 9,137,084 | B2 | 9/2015 | Degani et al. | |
| 2002/0070783 | A1 * | 6/2002 | Saeki | ........................ G06F 1/06 |
| | | | | 327/235 |
| 2004/0028159 | A1 * | 2/2004 | Abdelilah | ............. H04L 7/0062 |
| | | | | 375/350 |
| 2005/0140416 | A1 | 6/2005 | Rashid | |
| 2008/0026706 | A1 | 1/2008 | Shimizu et al. | |
| 2009/0289676 | A1 | 11/2009 | Takai | |
| 2010/0060334 | A1 | 3/2010 | Abe et al. | |
| 2011/0267120 | A1 | 11/2011 | Ravi et al. | |

(Continued)

FOREIGN PATENT DOCUMENTS

EP    2 833 548 A2    2/2015

OTHER PUBLICATIONS

Extended European Search Report received for European Patent Application No. 14177406.7, dated Feb. 2, 2015, 5 pages.

(Continued)

*Primary Examiner* — David S Huang
(74) *Attorney, Agent, or Firm* — Schiff Hardin LLP

(57) ABSTRACT

Described herein are technologies related to an implementation of a digital-to-time converter (DTC) circuitry that utilizes a first interpolation and a second and finer interpolation to increase interpolation ranges. The DTC circuitry generates a fine-phase modulated signal generating at least two correlated signals, and generating coarse and fine interpolations of the correlated signals.

20 Claims, 6 Drawing Sheets

(56) References Cited

U.S. PATENT DOCUMENTS

| | | |
|---|---|---|
| 2012/0062331 A1 | 3/2012 | Ravi et al. |
| 2014/0176201 A1 | 6/2014 | Weltin-Wu et al. |
| 2014/0266822 A1 | 9/2014 | Henzler et al. |
| 2015/0036767 A1 | 2/2015 | Degani et al. |
| 2015/0049840 A1 | 2/2015 | Banin et al. |

OTHER PUBLICATIONS

Jung, et al., "A CMOS Low-Power Digital Polar Modulator System Integration for WCDMA Transmitter", IEEE Transactions on Industrial Electronics, 2011, 16 pages.

K. H. Cheng, C. L. Hung and C. H. Chang, "A 0.77 ps. RMS Jitter 6-GHz Spread-Spectrum Clock Generator Using a Compensated Phase-Rotating Technique," in IEEE Journal of Solid-State Circuits, vol. 46, No. 5, pp. 1198-1213, May 2011.

Fei Yuan, "CMOS time-to-digital converters for mixed-mode signal processing", The Journal of Engineering, (Jan. 2014), doi:10.1049/joe.2014.0044, XP055233764 [T] * Section 4.2;; figure 4(a)(b).

European Search Report dated Mar. 2, 2017 for European Patent Application No. 16186694.

* cited by examiner

DIGITALLY CONTROLLED TWO-POINTS EDGE INTERPOLATOR

BACKGROUND

A Digital Polar Transmitter (DPTX) architecture may provide a reduced size and a reduced power consumption when compared to a conventional analog radio transmitter architecture. For example, a DPTX architecture may include two main functional blocks. One main functional block is a Digital-to-Time Converter (DTC) that modulates a local oscillator (LO) carrier with phase information of a signal that is to be transmitted. While the other main functional block is a Digital Power Amplifier (DPA) that modulates the amplitude of the signal that is to be transmitted onto the phase-modulated LO signal, thereby generating a reconstruction of the original signal (e.g., the signal to be transmitted).

A major technical challenge, among others, for DPTX architectures is to handle the wideband signals that are associated with modern communication protocols, such as IEEE 802.11 ac (commonly referred to as WiFi, and having a signal bandwidth of about 20-160 MHZ), and Long Term Evolution (commonly referred to as 4G LTE, and having a signal bandwidth of about 10-40 MHZ). These wide bandwidth signals are hard for DPTX architectures to handle because the bandwidths of the separate phase signal and the amplitude signal can respectively be about ten times and about three times greater than the bandwidth of the protocol signal.

DETAILED DESCRIPTION

Described herein is a technology for implementing a digital-to-time converter (DTC) in a device. Particularly, the DTC as described herein adapts in part and whenever applicable the DTC as described in Pub. No. US 2015/0036767 entitled, "Digitally Controlled Edge Interpolator (DCEI) for Digital to Time Converters (DTC)"; and Pub. No. US 2015/0049840 A1 entitled, "Digital-To-Time Converter and Methods for Generating Phase-modulated signals," which are herein referred to as a first reference and a second reference, respectively.

In the cited first and second references, the DTC may be implemented using three segments or components. That is, the DTC may include a first ultra-coarse tuning segment, a second coarse-tuning segment, and a third fine-tuning segment. However, as described herein, a functionality of the second coarse-tuning segment may be integrated with the third fine-tuning segment. With this integration, an input range for digitally controlled edge interpolator DCEI is increased, thereby increasing as well DCEI's interpolation range while the same amount of non-linearity in the previous DTC with three segments is maintained.

For example, the DTC having three segments may utilize a multi-modulus divider (MMD) as the first segment; a multiplexer (MUX) and coarse edge interpolator (CEI) as the second segment; and a DCEI as the third segment. In this example, the MUX and the CEI are removed from the DTC and the functionality of the MUX and the CEI may be replaced by a first (active) interpolator. The first interpolator, for example, may include an array where each cell may be configured to select from a first driver, a second driver, or both first and second drivers. In this example, a midpoint or average is derived between the selected drivers and to this end, the functionality of the MUX and the CEI is implemented by the first interpolator without the use of components and other circuitries that make up the MUX and the CEI components.

The DTC as described above may be used for frequency generation, internal clocking, signal modulation, and the like, in wireless devices, stand-alone devices, etc.

Figure 1:
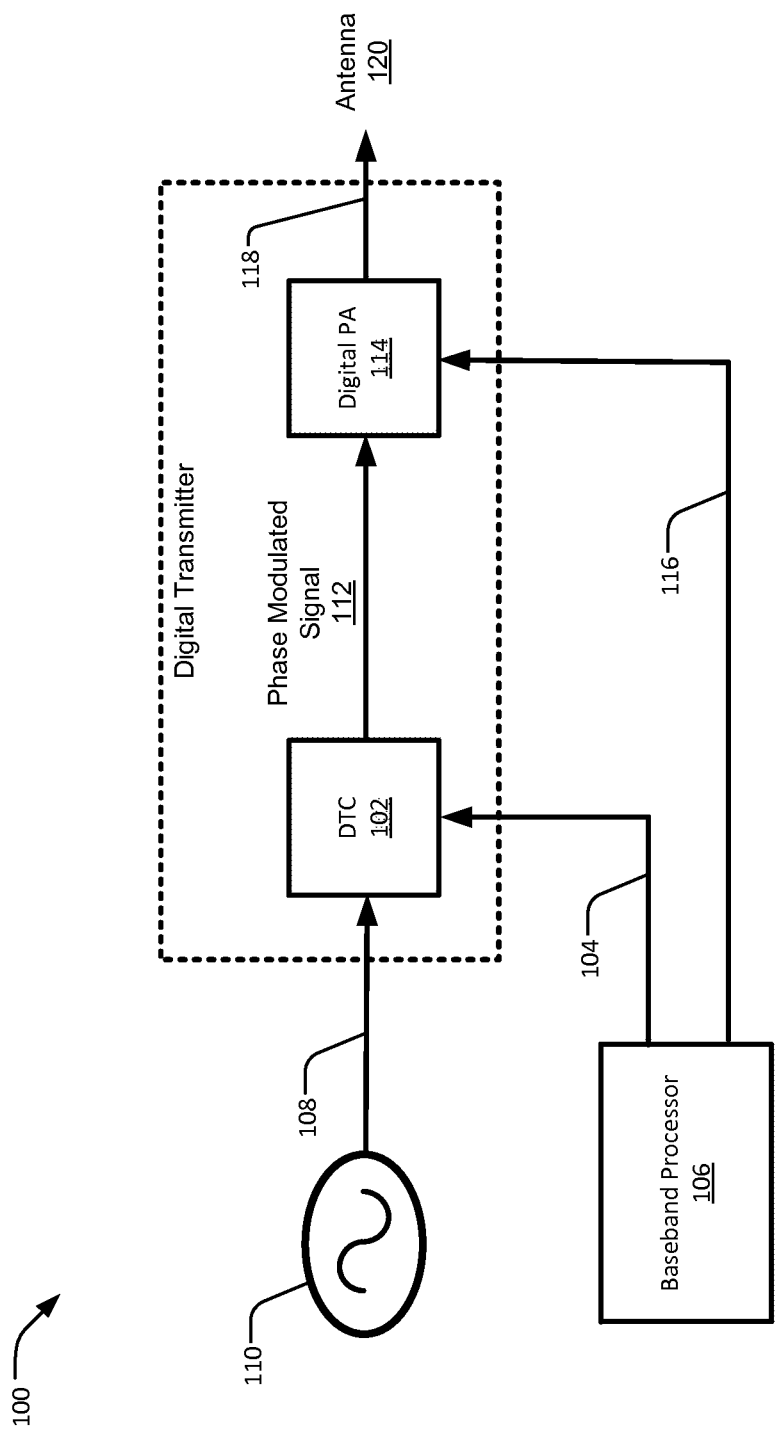
FIG. 1 illustrates an example block diagram of a digital transmitter as described in present implementations herein.

FIG. 1 is a block diagram of a digital transmitter 100 as described in present implementations herein. As shown, the digital transmitter 100 includes a digital-to-time converter (DTC) 102 that is configured to receive a phase data signal 104 (i.e., control word) from a base band processor 106, and a signal 108 from a voltage control oscillator (VCO) 110 (or digitally controlled oscillator). Based on the received signal 108 and the received phase data signal 104 as control signals, the DTC 102 is configured to output a phase-modulated signal 112.

The phase modulated signal 112 is received by a digital power amplifier (P/A) 114 and amplitude modulated by an amplitude control signal 116 to generate a (phase and amplitude) modulated radio frequency (RF) signal 118. The modulated RF signal 118 may be transmitted through one or more antennas 120.

As further discussed below, the DTC 102 utilizes a MMD and a DCEI that is coupled to the MMD. The MMD receives the signal 108 and is directly synchronized with rising and falling edges of the VCO 110. On the other hand, the DCEI provides the phase modulated signal 112 and is synchronized on either an input phase (feed-forward signal) or an output of the DTC 102 (feed-back signal).

By synchronizing the MMD with the rising and falling edges of the VCO 110, an input range of the DCEI is increased. In other words, with the increased input range, an interpolation range that is implemented at the DCEI as further discussed below is increased as well. Based on this configuration, the DTC 102 may provide a better power efficiency while keeping the same non-linearity efficiency of the DTC as those described by the first and second references.

In some embodiments, digital transmitter 100 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, the portable wireless communication device may include one or more of a keyboard, a display, a non-volatile memory port, multiple antennas, a graphics processor, an application processor, speakers, and other mobile device elements. The display may be a LCD screen including a touch screen. In some embodiments, the digital transmitter 100 may be part of a mobile communication device and is coupled to one or more antennas 120 configured for transmission of orthogonal frequency division multiplexed (OFDM) signals in a 3GPP LTE network.

The antennas 120 may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated to take advantage of spatial diversity and the different channel characteristics that may result between each of antennas and the antennas of a transmitting station.

Figure 2:
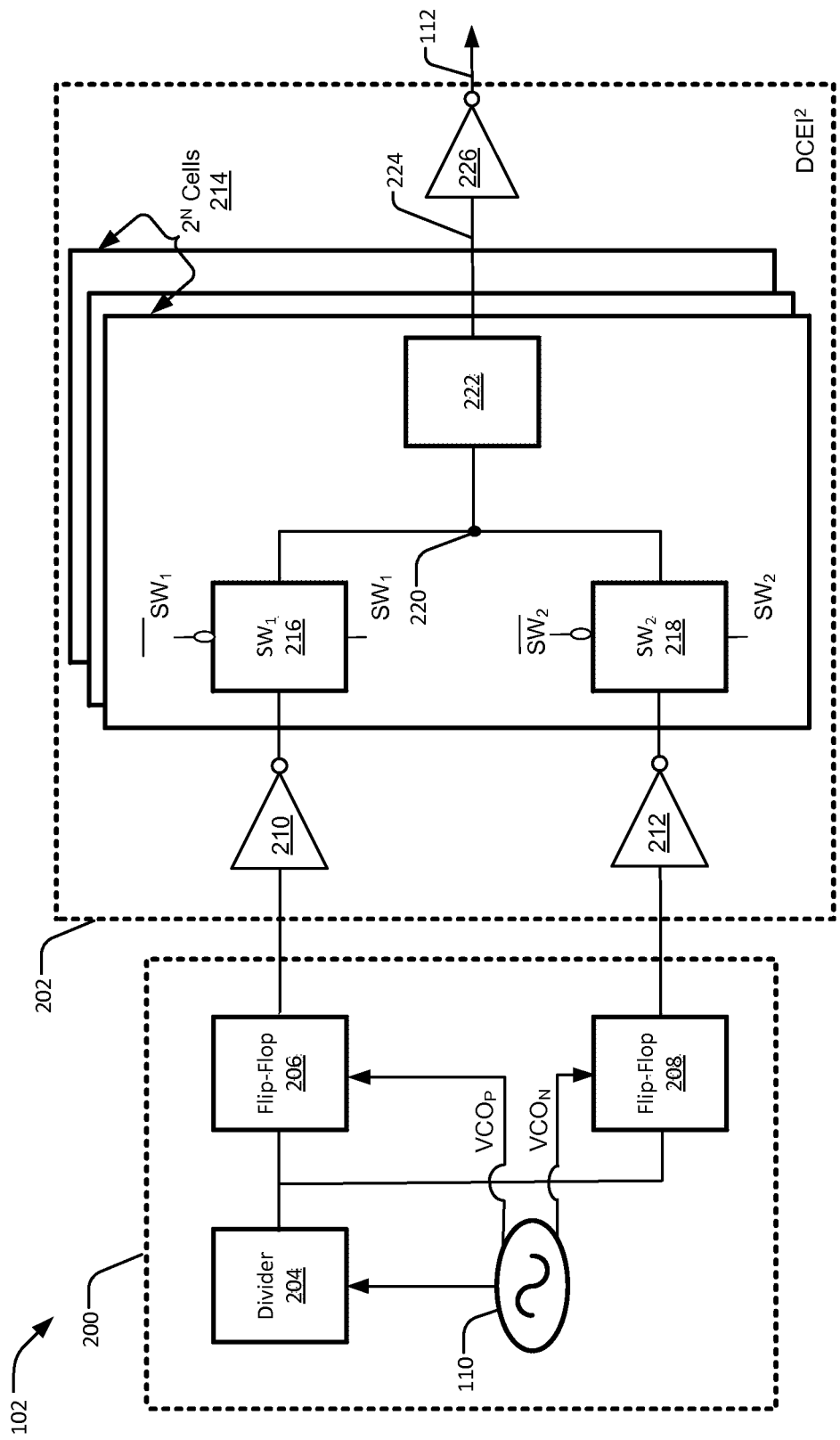
FIG. 2 illustrates an example digital to time converter (DTC) in accordance with implementations described herein.

FIG. 2 is an example DTC 102 as described in present implementations herein. As shown, the DTC 102 may include two segments i.e., MMD 200 and a digitally controlled two-point edge interpolator ($DCEI^2$) 202. The MMD 200, as a signal generator, may further include a divider 204, and flip-flops 206 and 208. The $DCEI^2$ 202, which is coupled to an output of the MMD 200, may further include inverters 210 and 212, and $2^N$ cells 214 where "N" is an integer and $2^N$ cells are representative of a data word for example, after phase or time modulation. Furthermore, each of the cell of the $2^N$ cells 214 may select and receive a first input $S_1$ 214 and/or a second input $S_2$ 216 whereby an output of the selected $S_1$ 214 and/or $S_2$ 216 are combined or tied to drive the same node, which is herein referred to as a first (active) interpolation 220.

In an implementation, each cell of the $2^N$ cells 214 may include a corresponding first interpolation 220 that is coupled to a inverter 222. In this implementation, an output 224 for each cell of the $2^N$ cells 214 are combined together to drive another node, which is herein referred to as a second (passive) fine interpolation 224. The first interpolation 220 (i.e., active interpolator) and the second fine interpolation 224 (i.e., passive interpolator) may depend upon the selections (i.e., $S_1$ 216 and/or $S_2$ 218) by each cell of the $2^N$ cells 214 where for example, a zero-crossing of a signal at each node is influenced by the selections made.

As described herein, the first interpolation 220 may perform the functionality of the MUX and CE of the cited second reference (i.e., US 2015/0049840 A1). At the same time, the first interpolation 220 may allow to pass either the VCO rising edge or VCO falling edge or have 50% interpolation between the VCO rising and falling edges (e.g., mid-point or $T_{VCO}/4$). To this end, the functionality of the MUX and the CEI in the cited second reference (US 2015/0049840 A1) is absorbed into the array that includes the first interpolation 220 and the second fine interpolation 224. The MUX and the CEI may include radio inputs that are shifted in time or phase to produce the phase modulated signal 112 where control signals are facilitated by the phase control signal 104 of FIG. 1. Furthermore, the MUX and the CEI may have the same frequency and treated as digital clock signals that are shifted in time or phase.

The second fine interpolation 224 may be coupled to an inverter 226 in order to act as a driver for the interpolated fine delay/phase output signal 112. Furthermore, the second fine interpolation 224 may be configured to average the output 224 from each cell of the $2^N$ cells 214. For example, for a total of four cells 214 (i.e., N=four), the second fine interpolation 224 may include a passive interpolation of each interpolated output of the four cells 214. In this example, each interpolated output of the four cells 214 may depend upon the selected or activated switches for each cell (i.e., each selects $S_1$ 216 and/or $S_2$ 218). The selected switches may control the correlated signal edges generated by the MMD 200, which will be phase modulated based upon the phase control signal 104 in FIG. 1.

Although the MMD 200 is utilized to generate at least two correlated signal edges at a fixed phase difference (i.e., correlated to the difference between VCO rising and falling edges), other configurations such as the MUX/CEI configuration discussed in the first and second references may be implemented as well. The configurations of the DTC in the cited first and second references may be utilized to implement the averaging of the two edges; however, as described earlier, the DTC 200 integrates the MUX and the CEI into the interpolations at the $DCEI^2$ 202.

With continuing reference to FIG. 2, the VCO 110 may generate an unmodulated clock or unmodulated oscillator signal that is subsequently phase modulated using the control word such as, for example, the phase control signal 104. The unmodulated oscillator signal may be received by the divider 204, which is a programmable divider to perform 2N or (2N+/−1) operation. The divider 204, for example, generates divider signals such as the divider signals 215 and 217 as discussed in the cited second reference (US 2015/0049840 A1).

With the generated divider signals, the flip-flops 206 and 208 may be configured to provide a rising-edge correlated signal and a falling-edge correlated signal, respectively. The outputs of the flip-flops 206 and 208 are subsequently processed through the inverters 210 and 212, respectively. To this end, the output of the inverters 210 and 212 may act as drivers to the first input $S_1$ 216 and the second input $S_2$ 218, respectively, to incorporate the functions of the MUX and CEI (of the cited second reference) into the array of the DTC 102.

Figure 3:
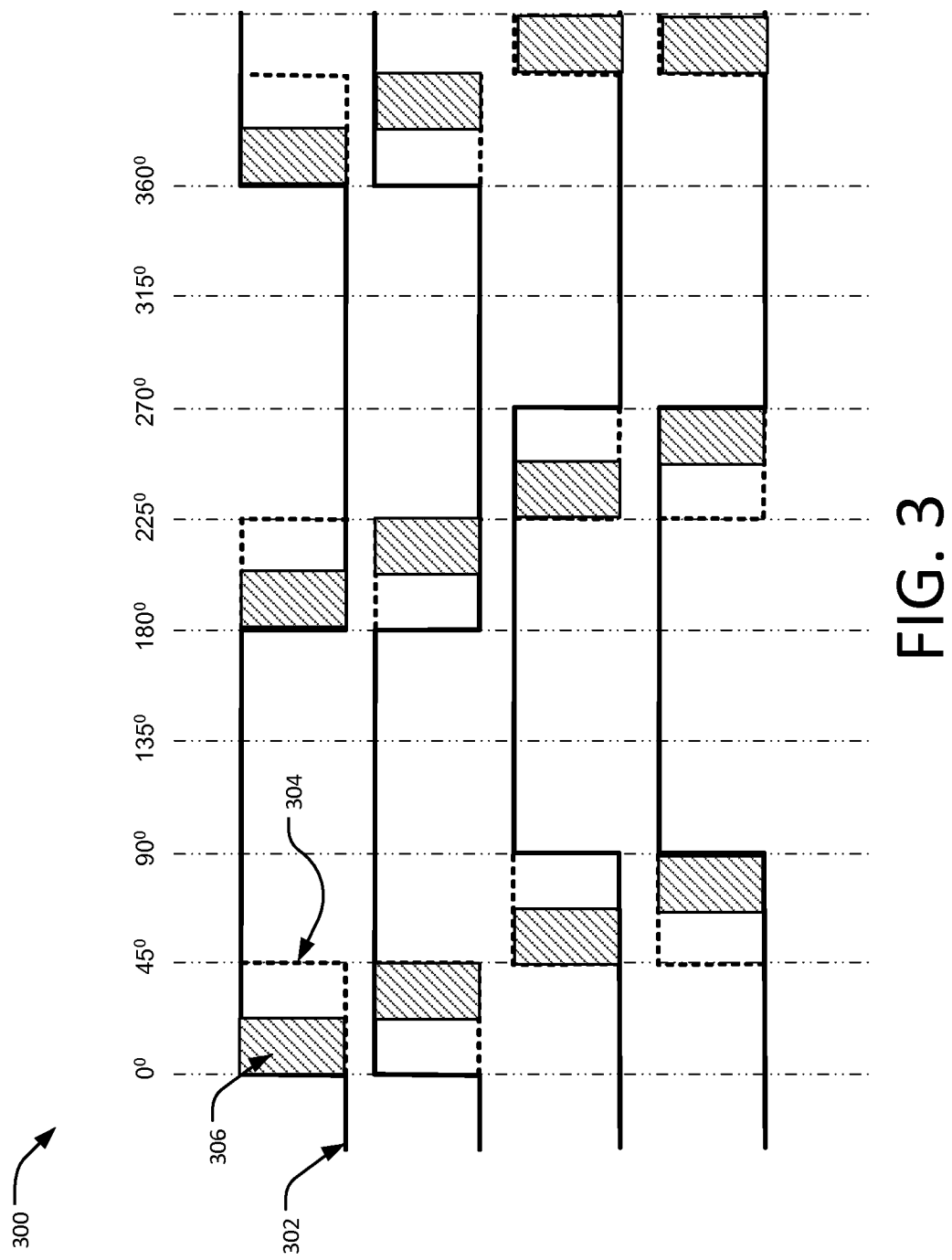
FIG. 3 is an example implementation of phase selection regions for each cell in an array of cells as described in present implementations herein.

FIG. 3 is an example implementation of phase selection regions by each cell in the array of $2^N$ cells as described in present implementations herein. As shown, the first input signal is represented by a solid line 302, a second input signal is represented by dotted lines 304, and an interpolation that is performed on a particular shift and control word is represented by area 306.

The phase selection region as described herein may cover 0 to 360 degrees shift as shown.

In an implementation, a decoder (not shown) of the array of cells such as the $2^N$ cells 214 may be configured to operate the array of $2^N$ cells in the following order:

First, the array of $2^N$ cells is assumed to have the first input 302 to precede the second input 304 by ½ VCO cycle as shown. At an initial code of zero, all cells in the array $2^N$ cells has S1='1' and S2='0', such that the input 1 is passed to output.

Second, as the code is stepped up, the S1 in all cells is kept at '1' and S2 is changed from '0' to '1', cell by cell until at code $2^N$ all cells S1='1' and S2='1'. As the cells S2 is changed, the first stage is now interpolating between input 1 and input 2, such that at the first interpolation node the edge is temporally 50% between input 1 and input 2.

Afterwards, the second passive interpolation is interpolating between input 1 and the 50% edge between input 1 and input 2. The resulting output edge, which is between input 1 edge and the 50% edge, depends on the number of cells having S2='1'.

Third, at code=$2^N$, all cells S1='1' and S2='1', the output edge is then placed at 50% between input 1 and input 2.

Thereafter, for a fourth step, the code may cause S1 to be changed from '1' to '0', cell by cell, while S2 are kept at '1', until the code reach $2^{N+1}$ where all cell S1='0' and S2='1'. At the cells S1 changed from '1' to '0' the first interpolation node now sees input 2 edge. Therefore, the output of the second passive interpolator the edge is located between 50% of input1/input2 and input2, depending on the number of cells at each position.

Fifth, when the code reaches $2^{N+1}$, all cells S1='0' and S2='1', the output edge is then placed at input 2.

Sixth, the MMD advance input 1 by a full VCO cycle, such that input 2 now precedes input 1 by ½ VCO cycle. Next, the controls on S1 and S2 are stepped in the reverse order of first to fifth steps. First S1 is changed from '0' to '1' cell by cell and the output edge advances from input 2 to 50% between input 1 and input 2. Once S1 in all cells is '1', S2 is changed from '1' to '0' cell by cell and the output advances from 50% between input 1 and input2 towards input 1.

Next, the MMD advances input 2 by a VCO cycle and the steps discussed above are repeated although the approach or steps as discussed above is not limited and may be applied at no particular order.

Figure 4:
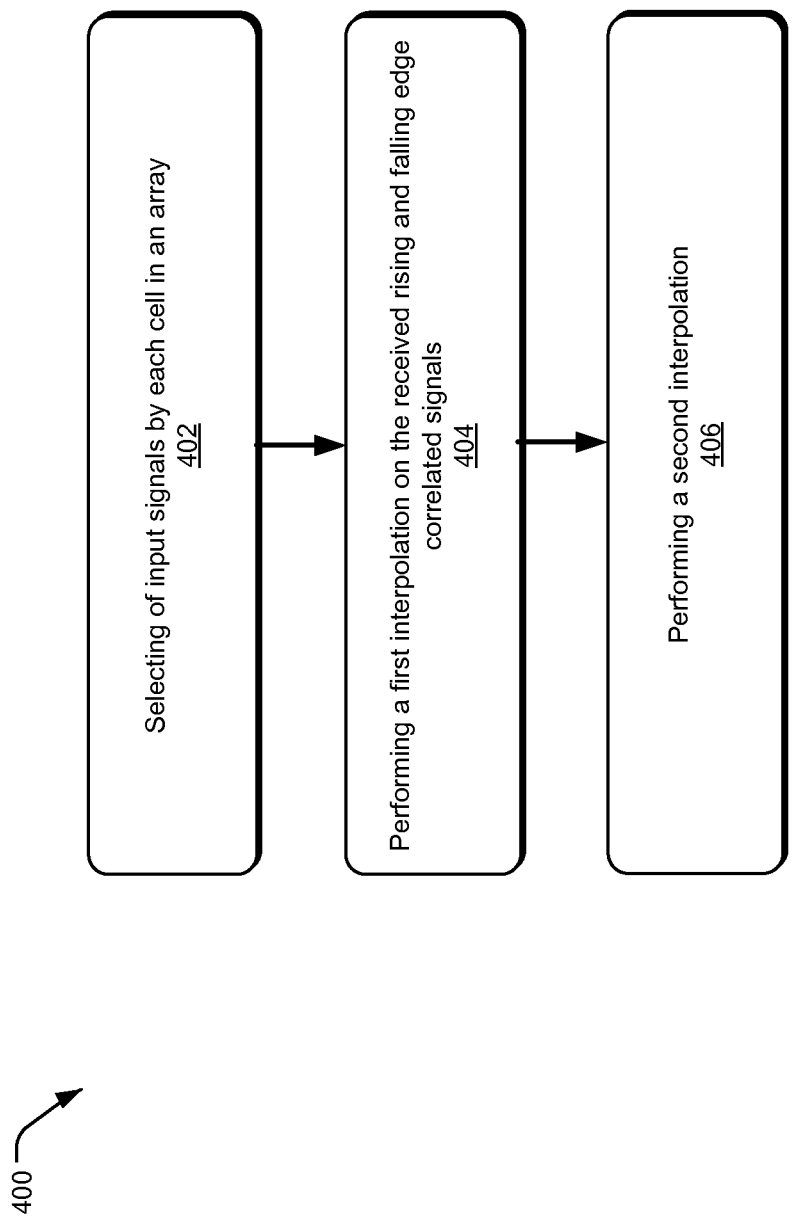
FIG. 4 illustrates an example flowchart for implementing a DTC in order to expand a digital controlled edge interpolator's (DCEI's) interpolation range.

FIG. 4 shows an example process flowchart 400 illustrating an example method for implementing a DTC in order to expand interpolation range while increasing power efficiency and maintaining the same non-linearity in the circuitry. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, selecting of input signals by a cell of an array of cells is performed. For example, each cell from the $2^N$ cells 214 may receive the same signals from the flip-flops 206 and 208. In this example, each cell may include a unique input controls from the phase control signal 104 in order to select the first input $S_1$ 216, the second input $S_2$ 218, or both. Furthermore, the cells in the array of $2^N$ cells 214 may be divided, for example into two groups where the number of cells for each group varies depending upon an input code of the DTC 102. Furthermore still, the array of $2^N$ cells 214 may represent a data word where each cell selects the first input $S_1$ 216, the second input $S_2$ 218, or both In an implementation, the input signals (i.e., first input $S_1$ 216, the second input $S_2$ 218) may include signals correlated to the rising-edge and the falling-edge of the VCO 110. For example, the rising-edge and the falling-edge correlated signals, at the start of interpolation, may be shifted by 45 degrees. In this example, the first interpolation 220 interpolates between the rising-edge and the falling-edge correlated signals in order to produce an output signal with a phase of zero to forty-five (0-45) degrees depending upon the received control word from the phase control signal 104.

At block 404 performing a first interpolation based upon the selected input signals is performed. For example, the output from the selected input signals form a single node such that the output is interpolated or averaged. In this example, the first interpolation 220 produces the averaged output between the input signals whereby the interpolation range is increased due the number of input signals that can be selected i.e., first input $S_1$ 216, the second input $S_2$ 218, or both.

At block 406, a second interpolation is performed. For example, each output 224 of each cell in the array of $2^N$ cells 214 are tied to form another node. In this example, a fine-coarse interpolation is implemented to produce the output edge that drives the phase modulated signal 112.

As discussed in the implementations above, the $DCEI^2$ 202 is implemented to include lesser number of stages and in between buffer stages as compared to the cited first and second references. As a result, there is a lower inherent propagation delay, noise reduction, and reduction in circuitry size in the DTC 102. Furthermore, the first interpolation 220 removes one layer of sync signals from the MUX and the CEI by incorporating their respective functionalities, and as such, the synchronization system in the DTC 102 is further simplified.

Figure 5:
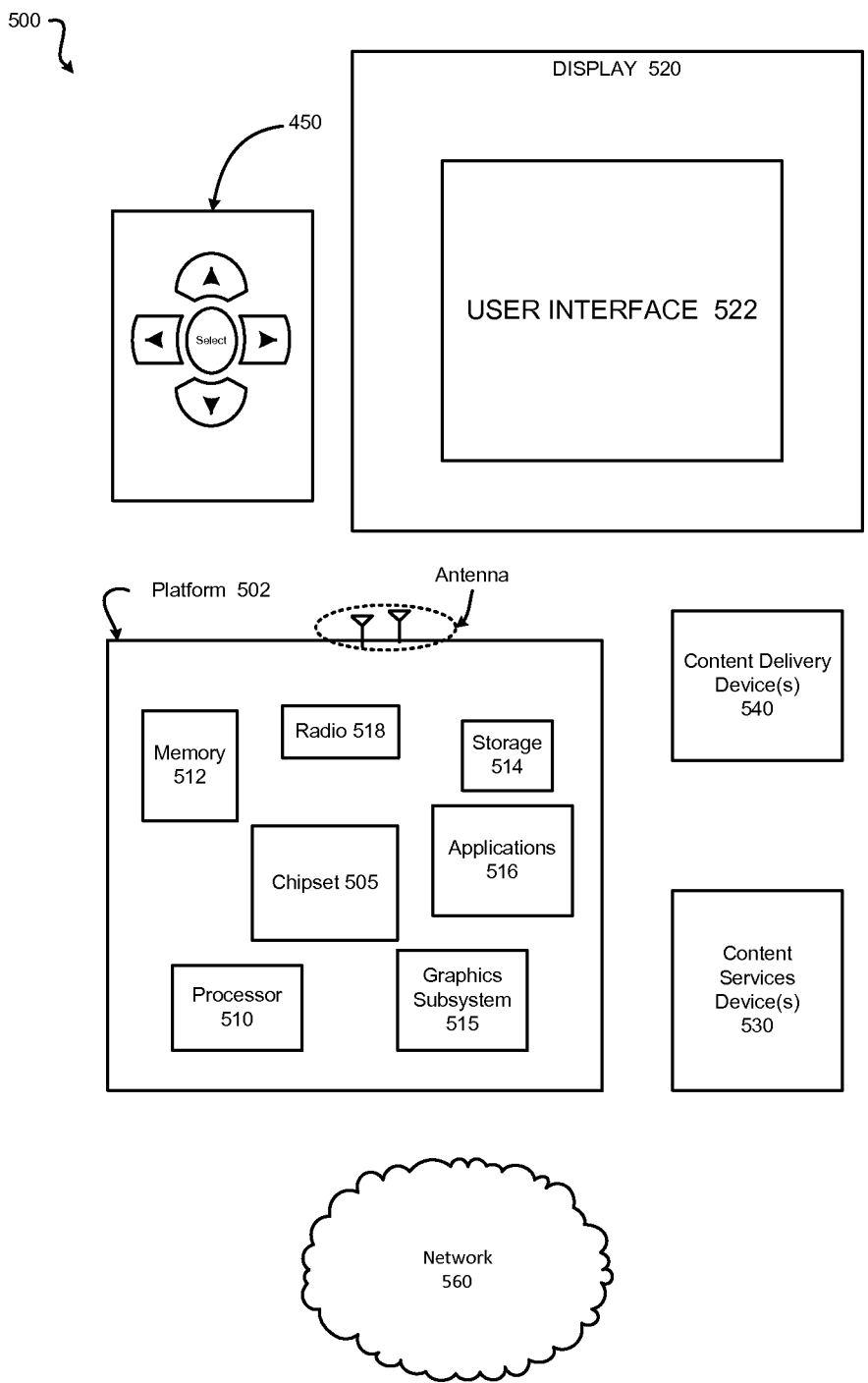
FIG. 5 illustrates an example system of a wireless device that utilizes a DTC described in accordance with implementations herein.

FIG. 5 illustrates an example system 500 of a wireless device in accordance with the present disclosure. For example, the DTC 102 is a circuitry block within the example system 500. In various implementations, the system 500 may be a media system although system 500 is not limited to this context. For example, system 500 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 500 includes a platform 502 coupled to a display 520. Platform 502 may receive content from a content device such as content services device(s) 530 or content delivery device(s) 540 or other similar content sources. A navigation controller 550 including one or more navigation features may be used to interact with, for example, platform 502 and/or display 520. Each of these components is described in greater detail below.

In various implementations, platform 502 may include any combination of a chipset 505, processor 510, memory 512, storage 514, graphics subsystem 515, applications 516 and/or radio 518. Chipset 505 may provide intercommunication among processor 510, memory 512, storage 514, graphics subsystem 515, applications 516 and/or radio 518. For example, chipset 505 may include a storage adapter (not depicted) capable of providing intercommunication with storage 514.

Processor 510 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 510 may be dual-core processor(s), dual-core mobile processor(s), and so forth.

Memory 512 may be implemented as a non-volatile memory device such as, the PCM memory cell. In an implementation, the memory 512 is coupled to the processor 510 and a transceiver circuit (e.g., radio 518), which utilizes the DTC 102 in its circuitry block.

Storage 514 may be implemented as another non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 514 may include technology to increase the storage performance enhanced protection for valuable digital media when multiple hard drives are included, for example.

Graphics subsystem 515 may perform processing of images such as still or video for display. Graphics subsystem 515 may be a graphics processing unit (GPU) or a visual processing unit (VPU), for example. An analog or digital interface may be used to communicatively couple graphics subsystem 515 and display 520. For example, the interface may be any of a High-Definition Multimedia Interface, Display Port, wireless HDMI, and/or wireless HD compliant techniques. Graphics subsystem 515 may be integrated into processor 510 or chipset 505. In some implementations, graphics subsystem 515 may be a stand-alone card communicatively coupled to chipset 505.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general-purpose processor, including a multi-core processor. In further embodiments, the functions may be implemented in a consumer electronics device.

Radio 518 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 518 may operate in accordance with one or more applicable standards in any version. Furthermore, the radio 518 is a part of a transceiver block in the system 500 that may utilize the DTC 102 in its circuitry block.

In various implementations, display 520 may include any television type monitor or display. Display 520 may include, for example, a computer display screen, touch screen display, video monitor, television-like device, and/or a television. Display 520 may be digital and/or analog. In various implementations, display 520 may be a holographic display. In addition, display 520 may be a transparent surface that may receive a visual projection. Such projections may convey various forms of information, images, and/or objects. For example, such projections may be a visual overlay for a mobile augmented reality (MAR) application. Under the control of one or more software applications 516, platform 502 may display user interface 522 on display 520.

In various implementations, content services device(s) 530 may be hosted by any national, international and/or independent service and thus accessible to platform 502 via the Internet, for example. Content services device(s) 530 may be coupled to platform 502 and/or to display 520. Platform 502 and/or content services device(s) 530 may be coupled to a network 560 to communicate (e.g., send and/or receive) media information to and from network 560. Content delivery device(s) 540 also may be coupled to platform 502 and/or to display 520.

In various implementations, content services device(s) 530 may include a cable television box, personal computer, network, telephone, Internet enabled devices or appliance capable of delivering digital information and/or content, and any other similar device capable of unidirectionally or bidirectionally communicating content between content providers and platform 502 and/display 520, via network 560 or directly. It will be appreciated that the content may be communicated unidirectionally and/or bidirectionally to and from any one of the components in system 500 and a content provider via network 560. Examples of content may include any media information including, for example, video, music, medical and gaming information, and so forth.

Content services device(s) 530 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 502 may receive control signals from navigation controller 550 having one or more navigation features. The navigation features of controller 550 may be used to interact with user interface 522, for example. In embodiments, navigation controller 550 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 550 may be replicated on a display (e.g., display 520) by movements of a pointer, cursor, focus ring, or other visual indicators displayed on the display. For example, under the control of software applications 516, the navigation features located on navigation controller 550 may be mapped to virtual navigation features displayed on user interface 522, for example. In embodiments, controller 550 may not be a separate component but may be integrated into platform 502 and/or display 520. The present disclosure, however, is not limited to the elements or in the context shown or described herein.

In various implementations, drivers (not shown) may include technology to enable users to instantly turn on and off platform 502 like a television with the touch of a button after initial boot-up, when enabled, for example. Program logic may allow platform 502 to stream content to media adaptors or other content services device(s) 530 or content delivery device(s) 540 even when the platform is turned "off." In addition, chipset 505 may include hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 500 may be integrated. For example, platform 502 and content services device(s) 530 may be integrated, or platform 502 and content delivery device(s) 540 may be integrated, or platform 502, content services device(s) 530, and content delivery device(s) 540 may be integrated, for example. In various embodiments, platform 502 and display 520 may be an integrated unit. Display 520 and content service device(s) 530 may be integrated, or display 520 and content delivery device(s) 540 may be integrated, for example. These examples are not meant to limit the present disclosure.

In various embodiments, system 500 may be implemented as a wireless system, a wired system, or a combination of both. When implemented as a wireless system, system 500 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 500 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 502 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 5.

As described above, system 500 may be embodied in varying physical styles or form factors. FIG. 5 illustrates implementations of a small form factor device 500 in which system 500 may be embodied. In embodiments, for example, device 500 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

Figure 6:
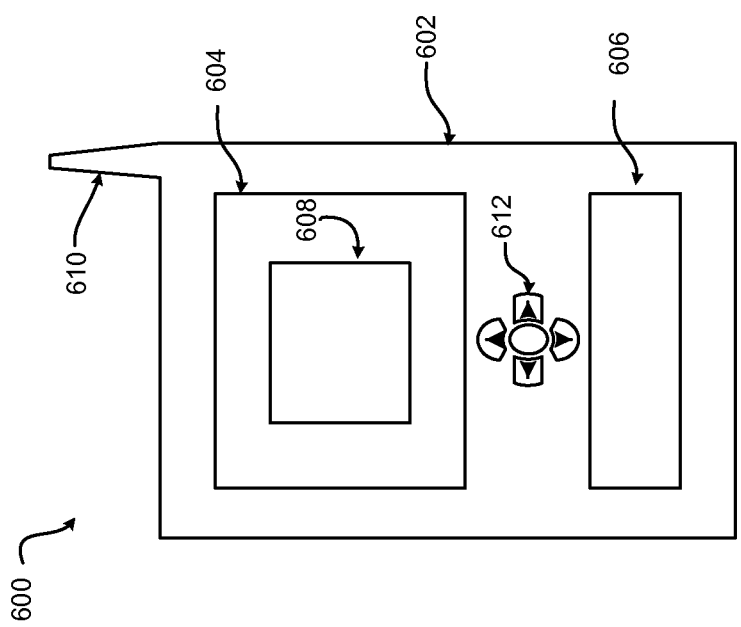
FIG. 6 illustrates an example device that utilizes a DTC in accordance with implementations described herein.

As shown in FIG. 6, device 600 may include a housing 602, a display screen 604, an input/output (I/O) device 606, a network interface card (NIC) 608 and a transceiver component 610. Device 600 also may include navigation features 612. The display screen 604 may include any suitable display unit for displaying information appropriate for a mobile computing device. For example, the display screen 604 displays the personalized message that the personalized communication program may generate. The I/O device 606 may include any suitable I/O device or user interface (UI) for entering information into a mobile computing device such as when the user 102 opts-in to the personalized communication program. Examples for I/O device 606 may include an alphanumeric keyboard, a numeric keypad, a touch pad, input keys, buttons, switches, rocker switches, microphones, speakers, voice recognition device and software, and so forth. Information also may be entered into device 600 by way of microphone (not shown). Such information may be digitized by a voice recognition device (not shown). The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The following examples pertain to further embodiments:

Example 1 is a digital-to-time converter (DTC) arranged to generate a fine-phase modulated output signal based on a control word, the DTC comprising: a signal generator configured to generate at least two correlated signals; a digital controlled edge interpolator (DCEI) configured to perform a first interpolation and a second interpolation of the at least two correlated signals to generate the fine-phase modulated signal, wherein the second interpolation is finer than the first interpolation.

In example 2, the DTC as recited in example 1, wherein the generated at least two correlated signals comprises a first signal correlated to a rising-edge of a signal from a voltage controlled oscillator (VCO) and a second signal correlated to a falling-edge of the signal from the VCO, wherein the first and second signals are at a fixed phase difference.

In example 3, the DTC as recited in example 1, wherein the signal generator is a multi-modulus divider (MMD) that is directly synchronized with rising and falling edges of a signal from a voltage controlled oscillator (VCO).

In example 4, the DTC as recited in example 1, wherein the DCEI is directly synchronized from an input signal from a feed-forward signal or an output signal from a feed-back signal.

In example 5, the DTC as recited in example 1, wherein the DCEI further comprises: a coarse interpolation component configured to perform the first interpolation, wherein the first interpolation component is formed by a cell node; and a fine interpolation component configured to perform the second interpolation by averaging an output of each cell node in an array of 2N cells, where "N" is an integer.

In example 6, the DTC as recited in example 5, wherein the cell node is a combined output from each cell based upon a selected first input signal, a selected second input signal, or a combined selection of the first and second input signals.

In example 7, the DTC as recited in example 6, wherein the first input signal is separate from the second input signal.

In example 8, the DTC as recited in examples 1 to 7, wherein the first interpolation comprises an active interpolation.

In example 9, the DTC as recited in any of examples 1 to 7, wherein the second interpolation comprises a passive interpolation.

Example 10 is a method of implementing a digitally controlled two-points edge interpolator (DCEI2), the method comprising: selecting of input signals by a cell of an array of cells; performing a first interpolation based upon the selected input signals by each cell in the array of cells; and performing a second interpolation of an output of the array of cells to generate a fine-phase modulated output signal.

In example 11, the method as recited in example 10, wherein the selecting of the input signals is based from a control word.

In example 12, the method as recited in example 10, wherein the selecting of the input signals comprises selecting of a first input signal, a second input signal, or both first and second input signals, wherein the first input signal is separate from the second input signal.

In example 13, the method as recited in example 12, wherein the first interpolation is a passive interpolation of the selected first input signal, the selected second input signal, or the selection of both first and second input signals.

In example 14, the method as recited in any of examples 10 to 12, wherein the first interpolation interpolates a rising edge or a falling edge of a voltage controlled oscillator (VCO), wherein the rising and falling edges are correlated at a fixed phase difference.

Example 15 is a device comprising: one or more processors; and a digital transmitter coupled to the one or more processors, the digital transmitter further comprises: a multi-modulus divider (MMD) configured to generate correlated signals; a digital controlled edge interpolator (DCEI) configured to perform a first interpolation and a second fine interpolation of the correlated signals to generate a fine-phase modulated signal.

In example 16, the device as recited in example 15, wherein the generated correlated signals comprises a rising-edge and a falling correlated signals.

In example 17, the device as recited in example 15, wherein the MMD is directly synchronized with rising and falling edges of a signal from a coupled voltage controlled oscillator (VCO).

In example 18, the device as recited in example 15, wherein the DCEI further comprises: a first interpolation component configured to perform the first interpolation, wherein the first interpolation component is formed by a cell node; and a second fine interpolation component configured to average an output of each cell node in an array of 2N cells, where "N" is an integer.

In example 19, the device as recited in example 18, wherein the cell node is a combined output of each cell based upon a selected first input signal, a selected second input signal, or a combined selection of the first and second input signals.

In example 20, the device as recited in any of examples 18 to 19, wherein the first interpolation and the second fine interpolation comprises an active interpolation and passive interpolation, respectively.

What is claimed is:

1. A digital-to-time converter (DTC) arranged to generate a fine-phase modulated output signal, the DTC comprising:
   a signal generator configured to generate at least two correlated signals;
   a digital controlled edge interpolator (DCEI) comprising an array of cell nodes, wherein each cell node of the array of cell nodes is configured to perform a first interpolation on the at least two correlated signals, wherein the DCEI performs a second interpolation on a combined output of each cell node to generate the fine-phase modulated output signal, wherein the second interpolation is finer than the first interpolation.

2. The DTC as recited in claim 1, wherein the generated at least two correlated signals comprises a first signal correlated to a rising-edge of a signal from a voltage controlled oscillator (VCO) and a second signal correlated to a falling-edge of the signal from the VCO, wherein the first and second signals are at a fixed phase difference.

3. The DTC as recited in claim 1, wherein the signal generator is a multi-modulus divider (MMD) that is directly synchronized with rising and falling edges of a signal from a voltage controlled oscillator (VCO).

4. The DTC as recited in claim 1, wherein the DCEI is directly synchronized from an input signal from a feed-forward signal or an output signal from a feed-back signal.

5. The DTC as recited in claim 1, wherein the DCEI further comprises:
a coarse interpolation component on each cell node and configured to perform the first interpolation; and
a fine interpolation component configured to perform the second interpolation by averaging the combined output of each cell node in an array of $2^N$ cells, where "N" is an integer.

6. The DTC as recited in claim 5, wherein each cell node comprises a first switch and a second switch that control the correlated signals from the signal generator, wherein the first interpolation performed by each cell node is based upon a selected first input signal, a selected second input signal, or a combined selection of the first and second input signals.

7. The DTC as recited in claim 6, wherein the first input signal is separate from the second input signal.

8. The DTC as recited in claim 1, wherein the first interpolation comprises an active interpolation.

9. The DTC as recited in claim 1, wherein the second interpolation comprises a passive interpolation.

10. A method of implementing a digitally controlled two-points edge interpolator ($DCEI^2$), the method comprising:
receiving of correlated signals from a signal generator;
selecting of input signals by a cell of an array of cells, the selecting is based upon the received correlated signals;
performing a first interpolation based upon the selected input signals by each cell in the array of cells; and
performing a second interpolation on a combined output of the cells in the array of cells to generate a fine-phase modulated output signal.

11. The method as recited in claim 10, wherein the selecting of the input signals is based from a control word from baseband processor.

12. The method as recited in claim 10, wherein the selecting of the input signals comprises selecting of a first input signal, a second input signal, or both first and second input signals, wherein the first input signal is separate from the second input signal.

13. The method as recited in claim 12, wherein the first interpolation is a passive interpolation of the selected first input signal, the selected second input signal, or the selection of both first and second input signals.

14. The method as recited in claim 12, wherein the first interpolation interpolates a rising edge or a falling edge of a voltage controlled oscillator (VCO), wherein the rising and falling edges are correlated at a fixed phase difference.

15. A device comprising:
one or more processors; and
a digital transmitter coupled to the one or more processors, the digital transmitter further comprises:
a multi-modulus divider (MMD) configured to generate correlated signals;
a digital controlled edge interpolator (DCEI) comprising an array of cell nodes, wherein each cell node of the array of cell nodes is configured to perform a first interpolation on the generated correlated signals, wherein the DCEI performs a second fine interpolation on a combined output of each cell node of the array of cell nodes to generate a fine-phase modulated signal.

16. The device as recited in claim 15, wherein the generated correlated signals comprises a rising-edge and a falling correlated signals.

17. The device as recited in claim 15, wherein the MMD is directly synchronized with rising and falling edges of a signal from a coupled voltage controlled oscillator (VCO).

18. The device as recited in claim 15, wherein the DCEI further comprises:
a first interpolation component on each cell node and configured to perform the first interpolation; and
a second fine interpolation component configured to average the combined output of each cell node in an array of $2^N$ cells, where "N" is an integer.

19. The device as recited in claim 18, wherein each cell node comprises a first switch and a second switch that control the correlated signals from the MMD, wherein the first interpolation performed by each cell node is based upon a selected first input signal, a selected second input signal, or a combined selection of the first and second input signals.

20. The DTC as recited in claim 15, wherein the first interpolation and the second fine interpolation comprises an active interpolation and passive interpolation, respectively.

* * * * *